United States Patent
Kato

(10) Patent No.: US 8,231,430 B2
(45) Date of Patent: Jul. 31, 2012

(54) WAFER PRODUCTION METHOD

(75) Inventor: Tadahiro Kato, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 910 days.

(21) Appl. No.: 12/227,894

(22) PCT Filed: May 11, 2007

(86) PCT No.: PCT/JP2007/059708
§ 371 (c)(1),
(2), (4) Date: Dec. 2, 2008

(87) PCT Pub. No.: WO2007/141990
PCT Pub. Date: Dec. 13, 2007

(65) Prior Publication Data
US 2009/0170406 A1 Jul. 2, 2009

(30) Foreign Application Priority Data
Jun. 8, 2006 (JP) .................................. 2006-159988

(51) Int. Cl.
*B24B 49/00* (2012.01)
*B24B 51/00* (2006.01)

(52) U.S. Cl. .................. 451/8; 451/21; 451/41; 451/44; 451/56

(58) Field of Classification Search .................. 451/6, 8, 451/21, 41, 43, 44, 56
See application file for complete search history.

(56) References Cited

U.S. PATENT DOCUMENTS

| | | | | |
|---|---|---|---|---|
| 5,738,563 | A | * | 4/1998 | Shibata ............................ 451/5 |
| 6,461,228 | B2 | * | 10/2002 | Stocker et al. .................. 451/44 |
| 7,189,149 | B2 | | 3/2007 | Katayama et al. |

FOREIGN PATENT DOCUMENTS

| | | |
|---|---|---|
| JP | A-2000-015548 | 1/2000 |
| JP | A-2000-084811 | 3/2000 |
| JP | A-2003-142434 | 5/2003 |
| JP | A-2004-214398 | 7/2004 |
| JP | A-2005-153085 | 6/2005 |

OTHER PUBLICATIONS

Supplementary European Search Report in European Patent Application No. 07 74 3143; dated Jul. 29, 2010.

* cited by examiner

*Primary Examiner* — Timothy V Eley
(74) *Attorney, Agent, or Firm* — Oliff & Berridge, PLC

(57) ABSTRACT

The present invention is a wafer production method at least comprising a chamfering step of chamfering a wafer sliced from an ingot using a grindstone for chamfering, and a step of obtaining a product wafer thinner than the chamfered wafer by performing at least one or more than one of the following processes on the chamfered wafer: flattening, etching, and polishing, the method at least comprising a correction step of chamfering a dummy wafer equivalent in thickness to the product wafer, measuring the chamfered dummy wafer for its chamfered shape, and correcting the shape of the grindstone for chamfering based on the measured chamfered shape of the dummy wafer, at least before the chamfering step, thereby chamfering the wafer sliced from the ingot using the grindstone for chamfering having its shape corrected. Thus, it is possible to provide a wafer production method allowing a product wafer with a desired chamfered shape to be obtained in a short period of time.

6 Claims, 8 Drawing Sheets

[Fig.1]
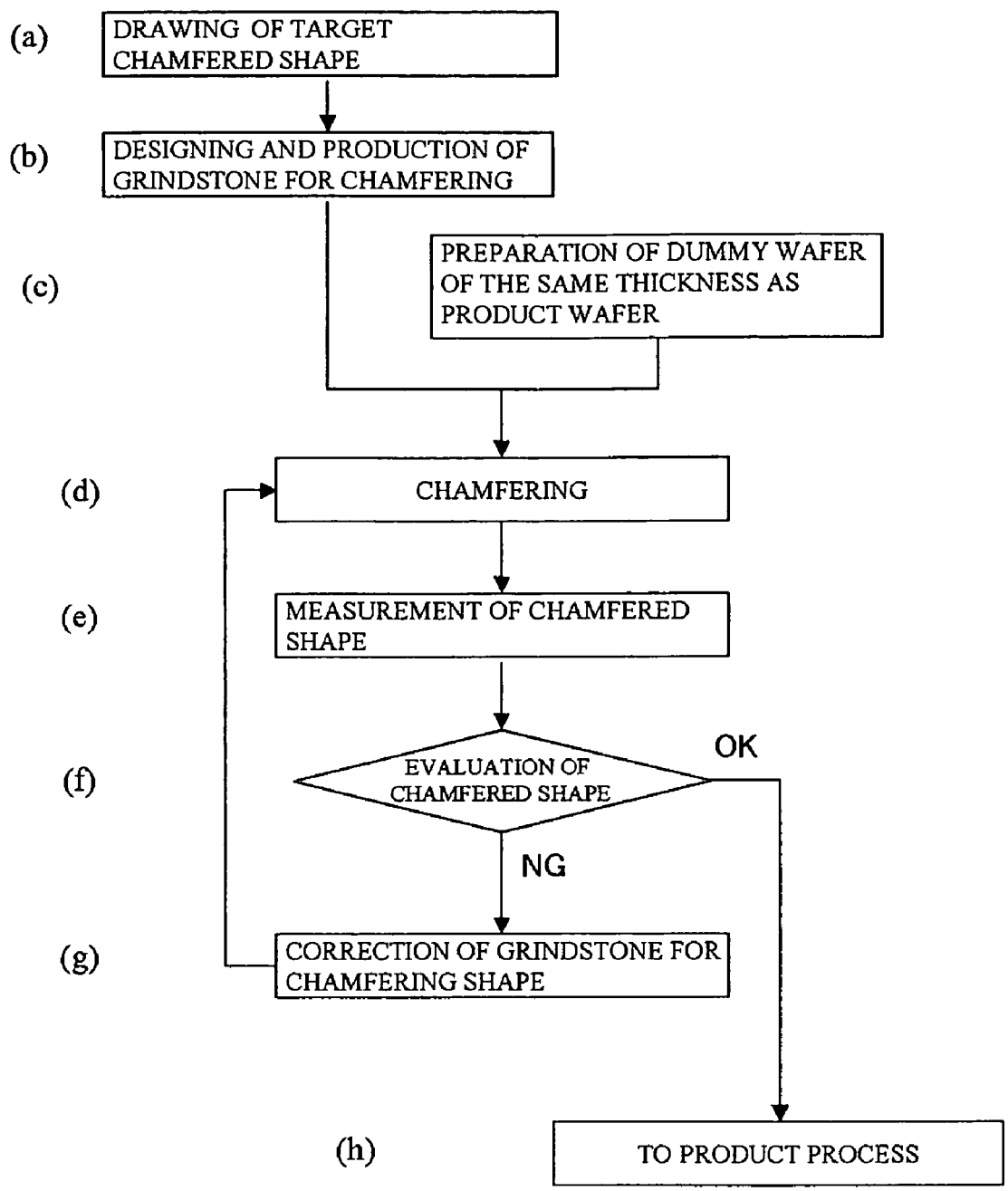

[Fig. 2]
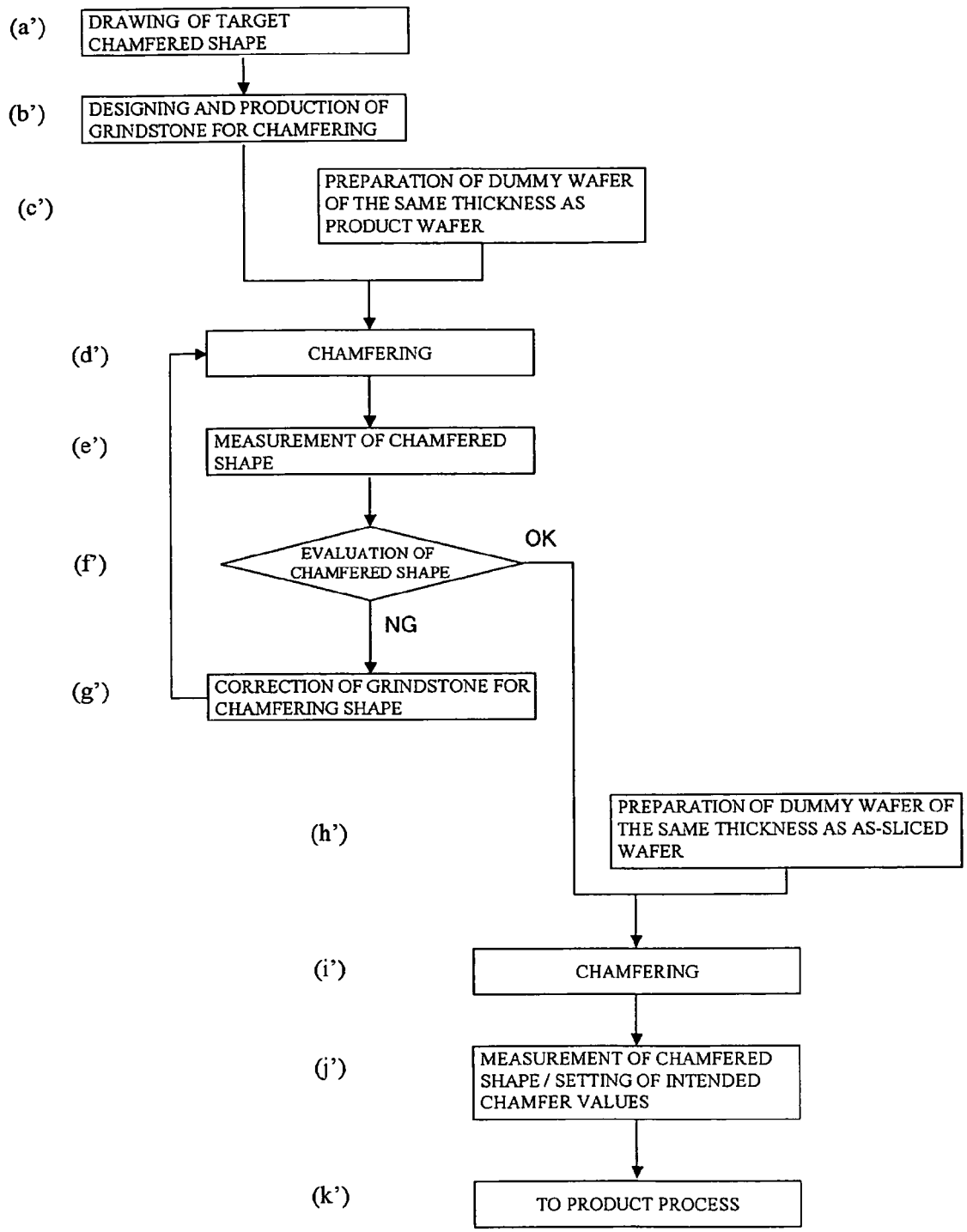

[Fig.3]
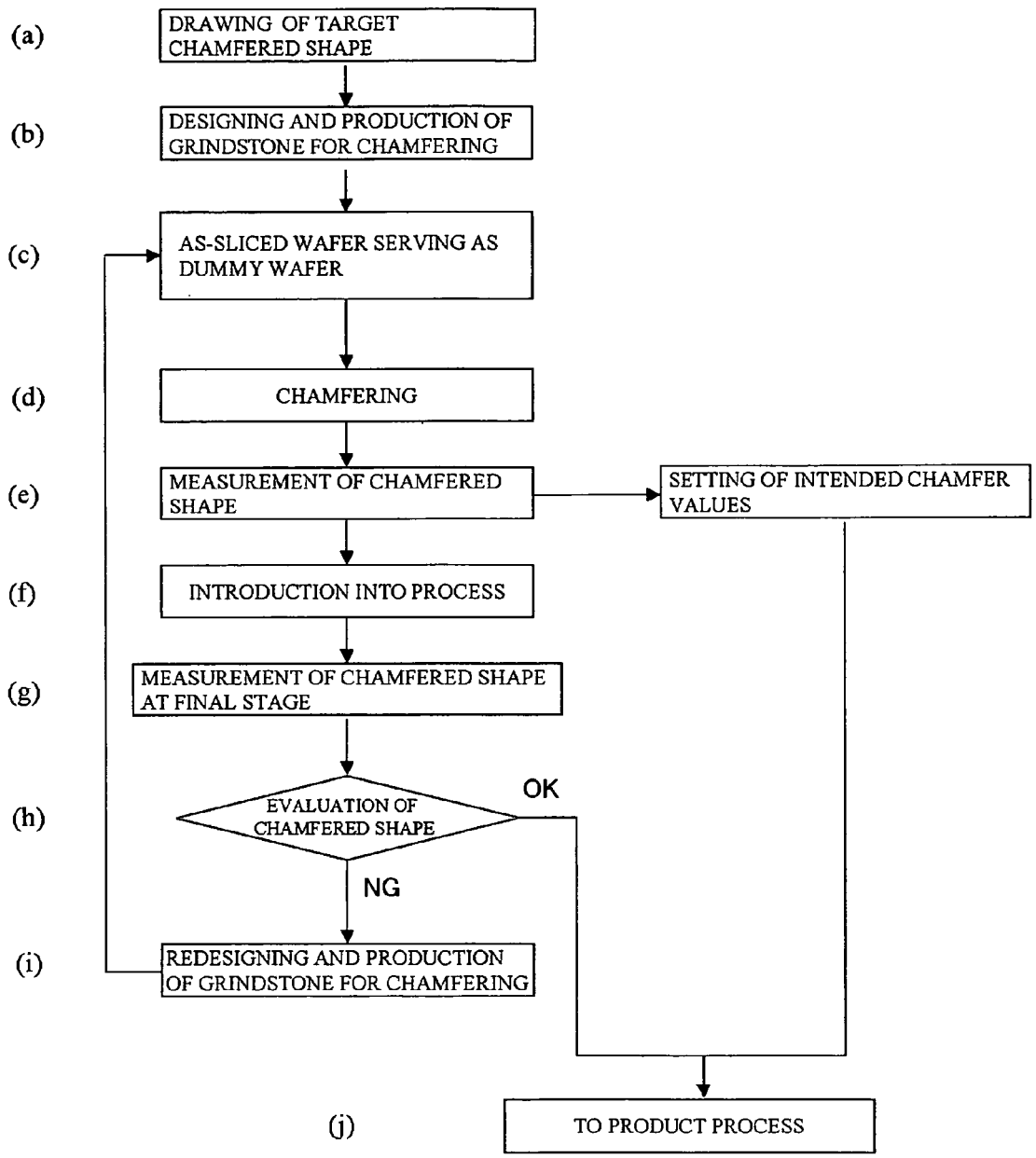

[Fig. 4]
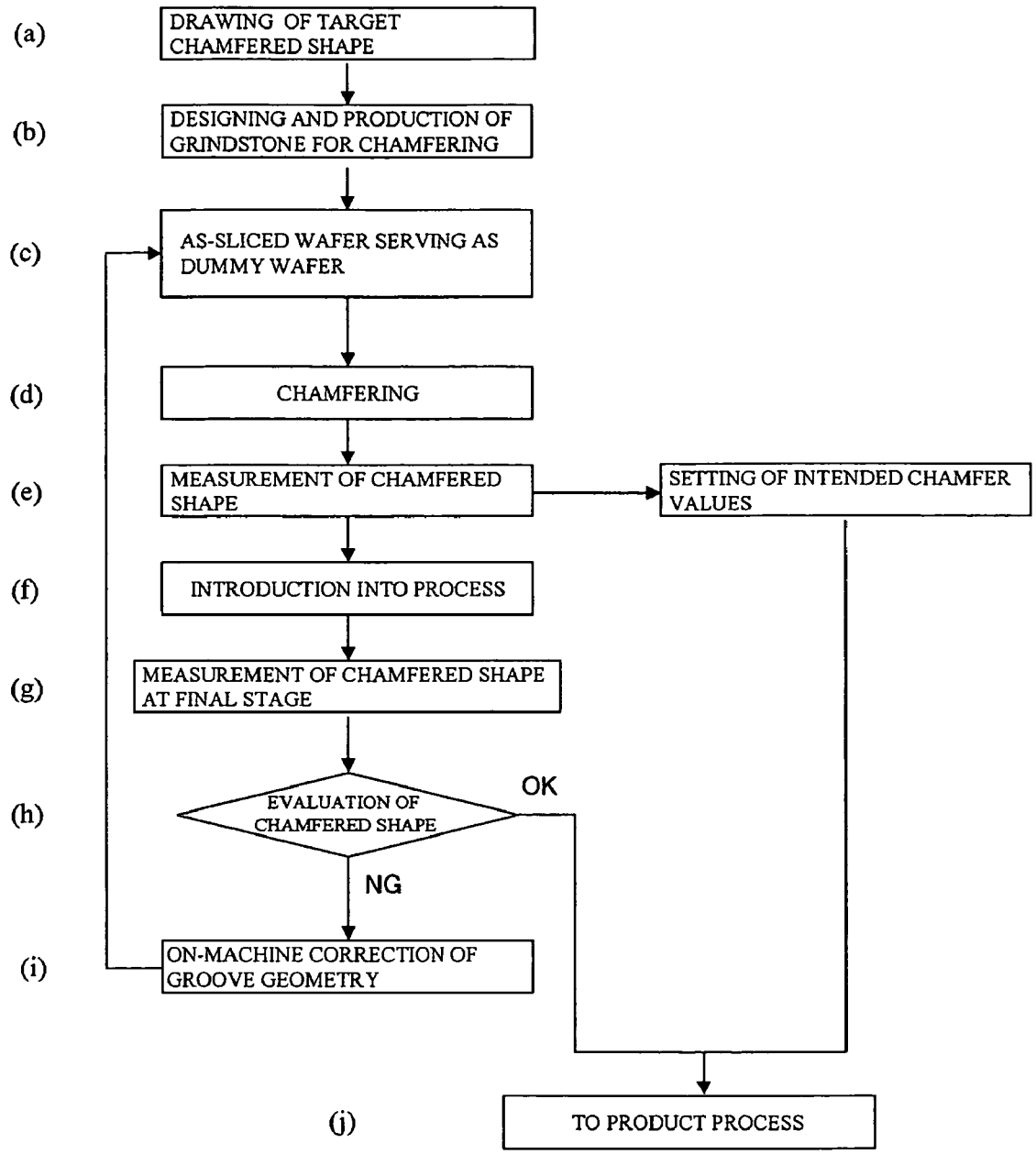

[Fig. 5]
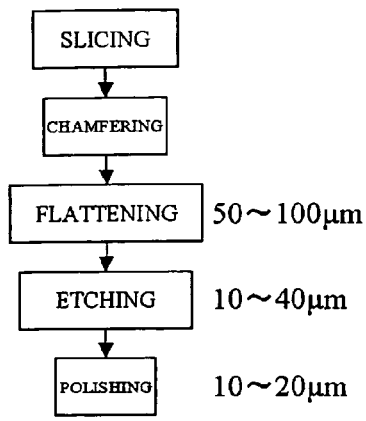
[Fig. 6]
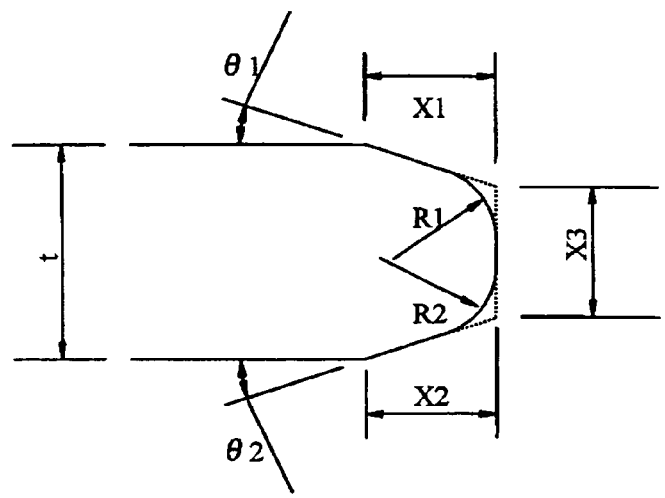
[Fig. 7]
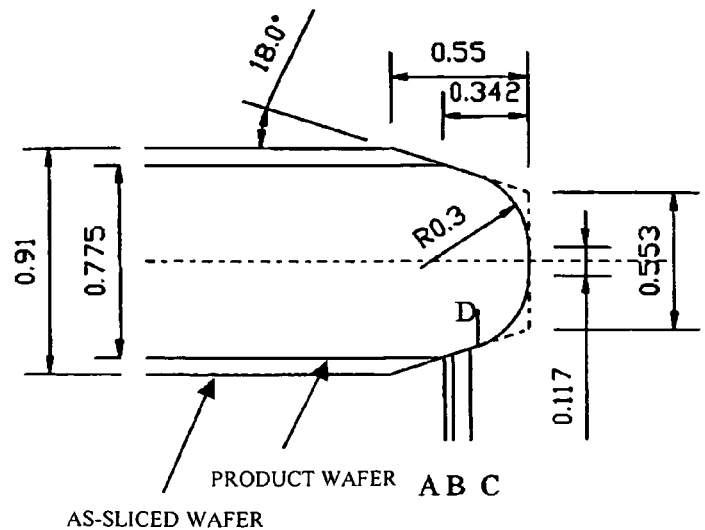

[Fig.8]
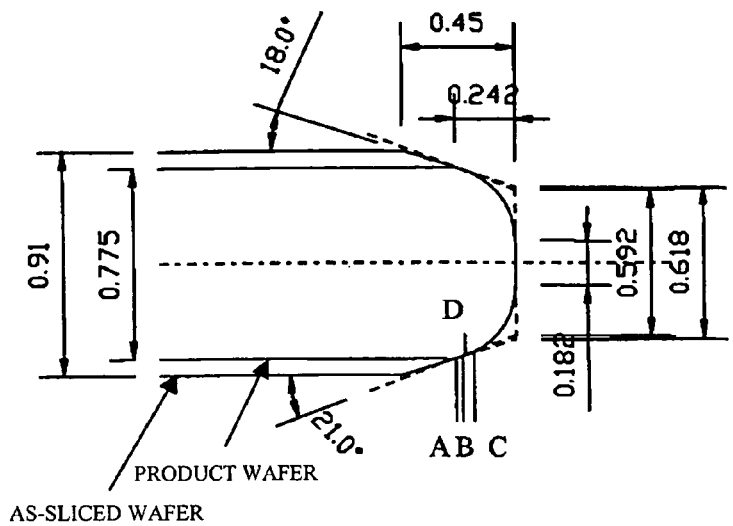
PRODUCT WAFER
AS-SLICED WAFER
[Fig.9]
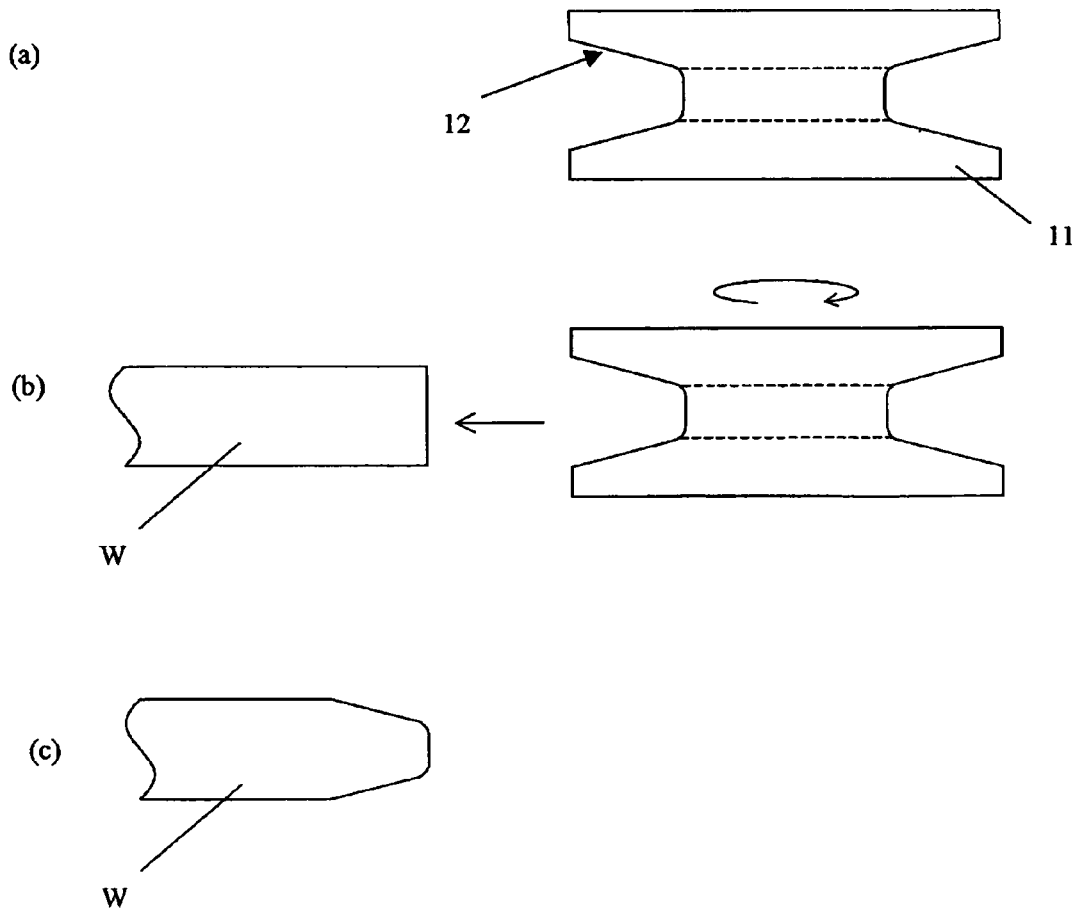

[Fig.10]
(a)
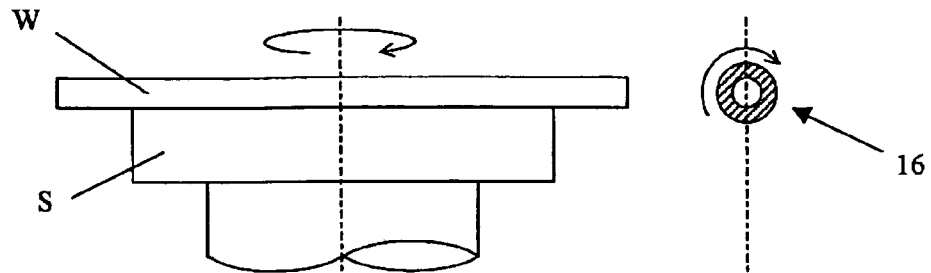
(b)
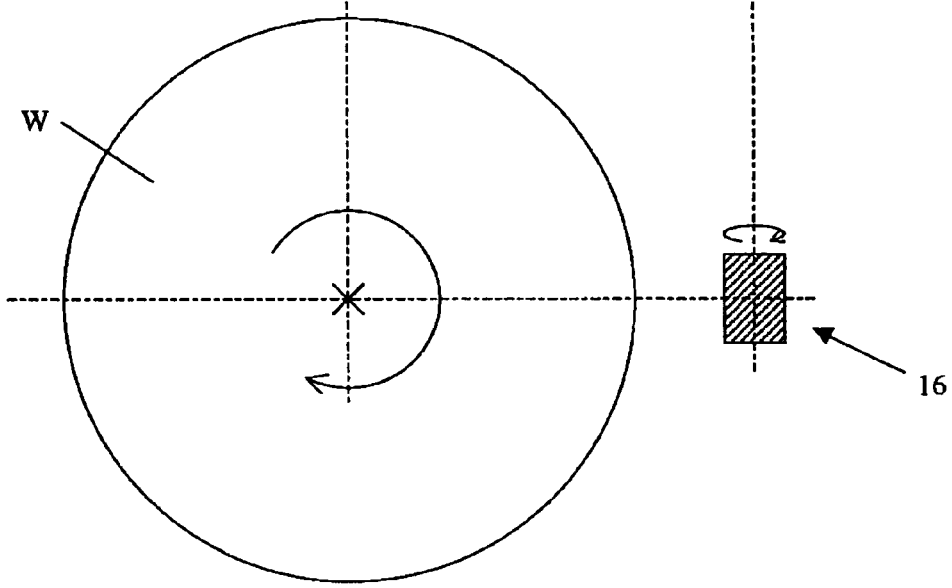
[Fig.11]
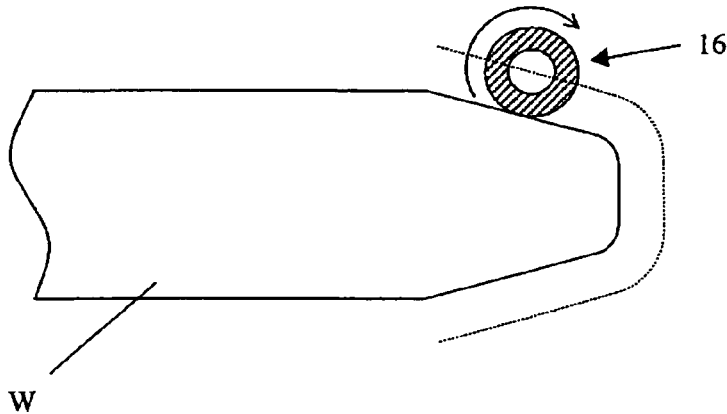

[Fig.12]
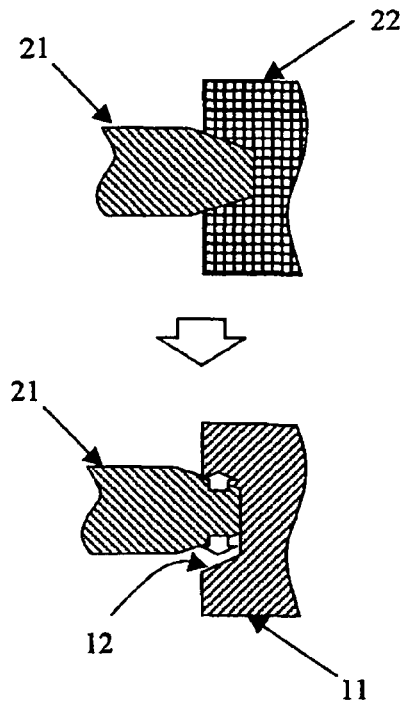
[Fig.13]
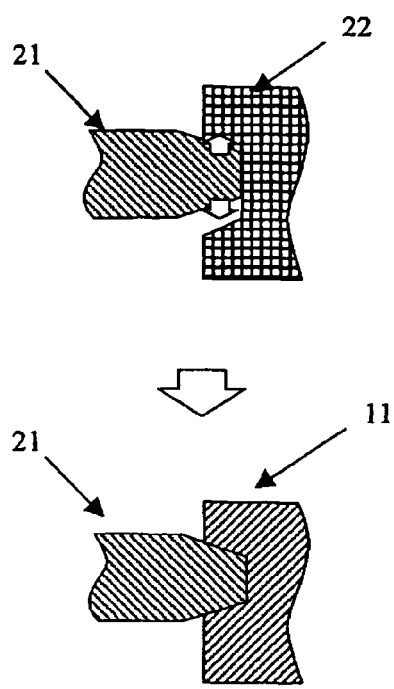

WAFER PRODUCTION METHOD

TECHNICAL FIELD

The present invention relates to wafer production methods, and more specifically to a wafer production method in which a wafer is chamfered while controlling the chamfered shape at the periphery of the wafer.

BACKGROUND ART

A semiconductor wafer for use in fabricating a semiconductor device is produced through the steps of, for example, chamfering, flattening, etching, mirror edge polishing, polishing, etc., which are performed after slicing a silicon single crystal ingot grown by the Czochralski method in the shape of a wafer. The semiconductor wafer thus produced is strictly controlled in terms of shape, and in recent years, there has been additional demand to improve dimensional precision of the chamfered shape.

One reason for this is, for example, due to the following situations. Increasingly employed for advanced devices using a large-diameter single crystal silicon wafer of 300 mm diameter or more is an immersion stepper based on a technique (immersion exposure technique) in which resolutions are enhanced by providing liquid (normally, pure water) between an objective lens and the silicon wafer, but in the case of exposure using such a technique, if there are variations in shape among chamfered portions of the wafer, the liquid is readily caused to leak from the chamfered portions of the wafer when scanning the outermost portion of the wafer. Therefore, there has been increasing demand on chamfered geometry of the wafer, concerning reviews, such as reduction in chamfer width, and improvements in dimensional precision.

In addition, time periods for temperature rise/fall during the heating cycle tend to be reduced in order to enhance productivity in the heat treatment process for diffusion and film formation during the device process. In this case, there is a concern that the silicon wafer might receive greater thermal shock than conventionally with the result that the wafer cracks. At the same time, the speed of feeding or suchlike is increased, and therefore there is a concern that the wafer might crack due to contacting the chamfered portions of the wafer with a feeder or a wafer carrier. In order to render the silicon wafer unsusceptible to their heat stress and mechanical stress, the necessity has arisen to strictly define the chamfered shape dimensions of the silicon wafer.

As for the standard for the chamfered shape of the silicon wafer, device makers, which are customers, often present the chamfered shapes of product silicon wafers they need. As shown in FIG. 5, board makers design, in drawings, intended chamfer values (process control values) for wafers subjected to a chamfering process, i.e., wafers sliced from an ingot (as-sliced wafers), flattened wafers, etched wafers, ground wafers, etc., based on process values for wafer thickness designed process by process, and process control is performed based on the intended chamfer values. Processing widths are typically 50 to 100 μm for the flattening process, 10 to 40 μm for the etching process, and 10 to 20 μm for the polishing process. Note that "flattening" as referred to hereinbelow encompasses various flattening methods, such as lapping and surface grinding.

As shown in FIG. 6, dimensions are defined for the standard for the chamfered shape. Roughly defined are: X1 for a chamfer width on the front surface side of the wafer; X2 for a chamfer width on the back surface side of the wafer; θ1 for an angle between the front surface of the wafer and the front surface side bevel; θ2 for an angle between the back surface of the wafer and the back surface side bevel; X3 for a distance between intersections of lines extended from the front and back surface side bevels of the wafer and a vertical line along an end surface; and R1 and R2 respectively for radii of round portions which are generally arced portions of the front and back surfaces of the wafer.

A grindstone for chamfering is produced based on the standard for the chamfered shape as predefined above, and the chamfering process is performed using the grindstone for chamfering, but in some cases, when a product wafer subjected to flattening, etching, polishing, etc., after actual chamfering is measured for dimensions of its chamfered portions, the dimensions might greatly deviate from target dimensions of the chamfered portions. In addition, such a phenomenon tends to be noticeable particularly for wafers with the lengths X1 and X2 reduced as frequently requested by customers these days.

To address the above problem, the following measures have been taken conventionally.

As shown in FIG. 3, in the conventional method, first, (a) a drawing indicating a target chamfered shape is provided by a customer, and (b) a grindstone for chamfering is designed and produced to achieve the chamfered shape. Next, (c) an as-sliced wafer serving as a dummy wafer is prepared, and (d) chamfered, and thereafter (e) the dummy wafer is measured for its chamfered shape. Next, (f) the dummy wafer is introduced into post-chamfering processes, (g) the wafer having undergone the final stage is measured for its chamfered shape to (h) obtain a difference from the target chamfered shape, and if there is a significant deviation, (i) a groove geometry is designed again to produce a grindstone for chamfering. Then, an as-sliced wafer serving as a dummy wafer is prepared to perform steps (c) to (h) again, and if the difference between the chamfered shape measured in step (g) and the target chamfered shape is sufficiently small, the dimension values measured in step (e) are set as intended chamfer values for the wafer to be produced, i.e., intended control values for the process of chamfering the product wafer, before (j) advancing to the product process for production of the product wafer.

Going through such steps is extremely inefficient because reproduction of the grindstone for chamfering takes one month or more, for example.

Recently, there is also performed a method as shown in FIG. 4 in which steps (a) to (h) are performed in the same manner as in the conventional method shown in FIG. 3 to process a dummy wafer to the final stage and thereafter obtain a difference between the chamfered shape of the dummy wafer and a target chamfered shape, and (i) the groove geometry of a grindstone for chamfering is modified on a chamfering machine by means of a chamfered shape correcting function provided in the chamfering machine (Japanese Unexamined Patent Publication (Kokai) No. 2005-153085).

However, even in the case of going through such steps, the processing of the silicon wafer still needs to be performed to its final stage, and there was a disadvantage in that it normally took about three to seven days until a desired chamfered shape was obtained.

DISCLOSURE OF INVENTION

Therefore, the present invention has been made in view of the issue as described, and an objective thereof is to provide a wafer production method allowing a product wafer with a desired chamfered shape to be obtained in a short period of time.

The present invention has been made to solve the above problem, and provides a wafer production method at least comprising a slicing step of slicing an ingot to obtain a wafer, a chamfering step of chamfering the wafer sliced from the ingot using a grindstone for chamfering, and a step of obtaining a product wafer thinner than the chamfered wafer by performing at least one or more than one of the following processes on the chamfered wafer: flattening, etching, and polishing, the method at least comprising a correction step of chamfering a dummy wafer equivalent in thickness to the product wafer, measuring the chamfered dummy wafer for its chamfered shape, and correcting the shape of the grindstone for chamfering based on the measured chamfered shape of the dummy wafer, at least before the chamfering step, thereby chamfering the wafer sliced from the ingot using the grindstone for chamfering having its shape corrected.

According to such a wafer production method as to comprise the correction step of chamfering a dummy wafer equivalent in thickness to the product wafer, measuring the chamfered dummy wafer for its chamfered shape, and correcting the shape of the grindstone for chamfering based on the measured chamfered shape of the dummy wafer, at least before the chamfering step, thereby chamfering the wafer sliced from the ingot using the grindstone for chamfering having its shape corrected, it is possible to accurately correct the shape of the grindstone for chamfering in a shorter period of time, and therefore a wafer with a desired chamfered shape can be produced in a short period of time. As a result, it becomes possible to produce wafers having a desired chamfered shape with high efficiency.

Note that "correcting the shape of the grindstone for chamfering" as used herein encompasses cases where no correction is performed if the measurement results of the chamfered shape indicate no need to perform correction.

In this case, the grindstone for chamfering is preferably corrected on machine.

By performing such an on-machine correction of the grindstone for chamfering, the grindstone for chamfering can be corrected in a shorter period of time, and therefore it becomes possible to produce a wafer with a desired chamfered shape in a shorter period of time.

In addition, the grindstone for chamfering has a forming groove, so that chamfering can be performed with the forming groove in contact with the periphery of the wafer. In addition, the grindstone for chamfering is a cylindrical rotary outer-diameter grindstone, and the rotary outer-diameter grindstone is movable relative to thickness and diameter directions of the wafer to chamfer the wafer.

In this manner, it is possible to correct the shape of the grindstone for chamfering to achieve an appropriate shape in a short period time, regardless whether the grindstone for chamfering having the forming groove is used to perform chamfering with the forming groove in contact with the periphery of the wafer, or the grindstone for chamfering is a cylindrical rotary outer-diameter grindstone that is movable relative to thickness and diameter directions of the wafer to chamfer the wafer. In addition, such a chamfering method allows a simple machine to produce a wafer with a desired chamfered shape.

Furthermore, it is preferable that at least after the correction step, the grindstone for chamfering having its shape corrected be used to chamfer a dummy wafer equivalent in thickness to the wafer sliced from the ingot, the chamfered dummy wafer be measured for its chamfered shape, and dimensions of the measured chamfered shape of the dummy wafer be set as intended chamfer values for the wafer sliced from the ingot.

In this manner, by chamfering a dummy wafer equivalent in thickness to an as-sliced wafer and setting intended chamfer values based on the chamfered shape thereof at least after a correction step to produce a wafer, it becomes possible to produce the wafer with reference to the intended values for chamfering the as-sliced wafer to be actually subjected to the product process. As a result, it becomes possible to produce wafers having a desired chamfered shape with more accuracy and efficiency.

As described above, the wafer production method according to the present invention allows a product wafer with a desired chamfered shape to be obtained in a short period of time.

BRIEF DESCRIPTION OF DRAWINGS

FIG. 1 is a flowchart illustrating an exemplary outline of a wafer production method according to the present invention;

FIG. 2 is a flowchart illustrating another exemplary outline of the wafer production method according to the present invention;

FIG. 3 is a flowchart illustrating an exemplary outline of a conventional wafer production method;

FIG. 4 is a flowchart illustrating another exemplary outline of the conventional wafer production method;

FIG. 5 is a flowchart illustrating the outline of a wafer product process and a processing width in each step thereof;

FIG. 6 is a cross-sectional view illustrating principal dimensions defined for a wafer chamfered shape;

FIG. 7 is a cross-sectional view illustrating exemplary target wafer chamfer dimensions;

FIG. 8 is a cross-sectional view illustrating an exemplary deviation between the target wafer chamfer dimensions and chamfer dimensions of a produced wafer;

FIG. 9 is a schematic view illustrating a wafer being chamfered by a grindstone for chamfering having a forming groove in which (a) is a schematic cross-sectional view of the grindstone for chamfering having a forming groove, (b) is a schematic cross-sectional view illustrating the grindstone for chamfering being moved closer to the wafer, and (c) is a schematic cross-sectional view illustrating the wafer chamfered by the grindstone for chamfering;

FIG. 10 is a schematic view illustrating a wafer being chamfered by a cylindrical rotary outer-diameter grindstone in which (a) is a schematic cross-sectional view, and (b) is a schematic top view;

FIG. 11 is a schematic view illustrating movement of the cylindrical rotary outer-diameter grindstone chamfering the wafer;

FIG. 12 is a cross-sectional view illustrating exemplary methods for correcting a truer and a grindstone for chamfering; and FIG. 13 is a cross-sectional view illustrating other exemplary methods for correcting a truer and a grindstone for chamfering.

BEST MODES FOR CARRYING OUT THE INVENTION

Hereinafter, the present invention will be described more concretely.

As described above, when a grindstone for chamfering is produced in advance based on the standard for the chamfered shape, and chamfered portions of a product wafer subjected to flattening, etching, polishing, etc., after actual chamfering are measured for their dimensions, in some cases, there arises a problem where the measured dimensions might considerably deviate from target dimensions of the chamfered portions. Furthermore, this phenomenon tends to be noticeable for wafers with reduced lengths X1 and X2.

The present inventors conducted the following study of the reason why there may be such a considerable difference between the target wafer chamfered shape and the chamfered shape of a wafer obtained as a product.

The following description is given by way of concrete examples with reference to FIG. 7.

A concrete example will be described in which an as-sliced wafer of 0.91 mm in thickness is chamfered to produce a product wafer of 775 μm (0.775 mm) in thickness with the chamfer widths X1 and X2 being 0.342 mm, the distance X3 between intersections of lines extended from the bevels of the chamfered portions and a vertical line along an end surface being 0.533 mm, the bevel angles θ1 and θ2 being 18.0°, and the radii R of the round portions being 0.3 mm.

Normally, measuring systems for measuring chamfered shapes for process control and shipping inspection employ a general transmissive light method, and perform image binarization on captured images.

Algorithms for measuring chamfered shapes, particularly conditions for setting θ values are based on a straight line extending between two points in which one point (point B) lies at a distance corresponding to 10% of the length of X1 or X2 from the border A between the chamfered bevel and the front or back surface and the other point (point C) lies at a distance corresponding to 30% of the length, or based on a straight line determined by the bestfit between the two points.

When the length of X1 (X2) required for the product wafer is 0.342 mm as shown in FIG. 7, the length of X1 (X2) defined for the as-sliced wafer in the chamfering process is about 0.55 mm on a simple geometrical basis indicated by the following equation (1).

[Equation 1]

$$D_i = D_f + \frac{\Delta}{\tan\theta} \quad (1)$$

$D_i$: design value for X1 (X2) of the as-sliced wafer
$D_f$: design value for X1 (X2) of the product wafer
$\Delta$: (amount of processing until the product wafer)/2
$\theta$: design value for θ1 (θ2)

When the round portion has a radius R of 0.3 mm, the boundary point D between the round portion and the bevel portion does not lie between B and C, and therefore in principle, θ1, θ2, and X3 of the chamfered shape do not vary between the as-sliced wafer and the final wafer.

However, when an immersion stepper is employed as described earlier, the lengths X1 and X2 of a required shape are shorter. A similar study was conducted for a concrete example in which the lengths X1 and X2 are about 0.25 mm, which is relatively short.

In the case where the target lengths X1 and X2 of the product wafer are set to 0.242 mm, when the as-sliced wafer is 0.91 mm thick, the length X1 (X2) is 0.45 mm on the geometrical basis indicated by equation (1), and the lengths X1 and X2 expected for the product wafer of 775 μm (0.775 mm) in thickness are about 0.24 mm. When R is 0.3 mm, the boundary point D between the round portion and the bevel portion lies between B and C, and therefore the straight lines for determining θ1 and θ2 deviate by about 3° from their respective straight lines as designed. Furthermore, the value of X3 that is calculated based on θ1 and θ2 is smaller than its design value by 0.026 mm (see FIG. 8). Normally, variations of the required chamfer geometry are about ±0.03 to 0.04 mm, and therefore the dimensional deviation as described above is normally significant to such an extent that the grindstone for chamfering needs to be redesigned and reproduced.

Specifically, since the measuring system for measuring the chamfered shape employs a transmissive light method as described above, when X1 and X2 are relatively short, measurement variations due to the algorithms readily occur. Concretely, the inclination of the linearly graded portion should originally be measured as θ1 (θ2), but it is measured inclusively of the round portion, so that in some cases, the obtained values for θ1 and θ2 may vary toward larger values, and furthermore, it has been found that, in such a case, the value for X3 to be calculated based on θ1 and θ2 becomes shorter accordingly.

Experimental Examples

To confirm these phenomena, a wafer was actually produced with the lengths X1 and X2 being about 0.24 mm, and measurement data for the chamfered shape of the as-sliced wafer and measurement data for the chamfered shape of the produced product wafer are shown in Table 1.

TABLE 1

|  | θ1(°) | θ2(°) | X3(mm) |
| --- | --- | --- | --- |
| Design shape | 16 to 20 | 16 to 20 | 0.59 to 0.65 |
| Post-chamfering shape | 17.5 to 18.6 | 17.3 to 18.8 | 0.615 to 0.628 |
| Shape of product wafer | 20.8 to 22.1 | 21.2 to 21.9 | 0.578 to 0.602 |

From the results in Table 1, the above phenomenon was confirmed, i.e., the chamfered shape falls within the range of the target chamfered shape at the time of chamfering of the as-sliced wafer, but the dimensions of the chamfered shape of the product wafer significantly deviate from the target dimensions of the chamfered shape.

Note that the distance between points B and C in the chamfered shape measurement conditions can be shortened (e.g., point C is set to be at a 20% point of the length X1 or X2), thereby reducing an error due to the round portion, but on the other hand, measurement accuracy in bevel angle is reduced. As a result, matching of the chamfered shape, on the contrary, becomes more difficult.

Therefore, based on these findings, the present inventors were deeply committed to experiments and studies, finding that by carrying out chamfering in advance using a dummy wafer of the same thickness as the product wafer, and thereafter measuring the chamfered shape of the dummy wafer to evaluate the difference from the target chamfered shape and correct the shape of the grindstone for chamfering, the product wafer with the target chamfered shape can be produced in a period of time shorter than can be conventionally produced, thereby completing the present invention.

Hereinafter, the present invention will be described more concretely with reference to the drawings, but the present invention is not limited to this FIG. 1 is a flowchart illustrating an example of the first embodiment of a wafer production method according to the present invention. The first embodiment of the present invention is as outlined below.

First, in step (a), a drawing indicating a chamfered shape of a target product standard is prepared.

For example, this drawing defines dimensions as in FIG. 6 described earlier, including the chamfer width X1 on the front surface side of the wafer, the chamfer width X2 on the back surface side of the wafer, the angle θ1 between the front surface and the front surface side bevel of the wafer, the angle θ2 between the back surface and the back surface side bevel of the wafer, the distance X3 between intersections of lines extended from the bevels on the front and back sides of the wafer and a vertical line along an end surface, and the radii R1 and R2 of the respective round portions which are generally arced portions of the front and back surfaces of the wafer.

Such a target chamfered shape of the product is determined in advance by the standard in accordance with the intended use of the wafer, for example.

Next, in step (b), a grindstone for chamfering is designed and produced based on the drawing prepared in step (a). The grindstone for chamfering designed and produced here can be in any shape and perform chamfering by any operation so long as a wafer can be chamfered into a desired shape, but for example, the following grindstones are preferable in that they are in a relatively simplified shape and can chamfer the wafer by a simple operation.

One is a grindstone for chamfering 11 having a forming groove 12 as shown in FIG. 9 ((a) of FIG. 9).

Such a grindstone for chamfering 11 is rotated and forced laterally onto a rotating wafer W being held horizontally ((b) of FIG. 9) to transfer its shape onto the wafer W for chamfering ((c) of FIG. 9).

Another one is a cylindrical rotary outer-diameter grindstone 16 as shown in FIG. 10.

The wafer W held on an autorotatable vacuum chuck stage S and the cylindrical rotary outer-diameter grindstone 16 for chamfering the end surface of the wafer can be moved and controlled independent of each other on machine relative to thickness and diametric directions of the wafer W, and their respective moving distances can be controlled to obtain a desired chamfered shape.

The wafer W can be chamfered by rotating such a cylindrical rotary outer-diameter grindstone while moving the center of the rotary outer-diameter grindstone 16 as indicated by the dotted lines in FIG. 11, for example.

Note that grindstones for chamfering made up of various materials, such as a metal grindstone and a resin grindstone, can be used, but in the case of, for example, correcting the shape of the grindstone for chamfering on machine as will be described below, it is preferable to use a grindstone made up of a material that facilitates the shape correction, such as a resin grindstone.

Next, in step (c), a dummy wafer equivalent in thickness to a product wafer to be ultimately produced is prepared. The thickness of the product wafer is determined in advance by the standard as described earlier.

In addition, to make the product wafer out of the as-sliced wafer, it is necessary to go through the steps of flattening, etching, polishing, etc., and the thickness is gradually reduced by these steps. Accordingly, the dummy wafer prepared in step (c) is of the same thickness as the product wafer thinner than the as-sliced wafer. Here, flattening encompasses any conventional flattening processes, such as lapping and surface grinding, and any one, two, or more of such processes may be selectively performed depending on convenience.

Next, in step (d), the grindstone for chamfering designed and produced in step (b) is used to perform chamfering on the dummy wafer prepared in step (c) equivalent in thickness to the product wafer. The chamfering performed here is carried out in the same manner as in conventional methods except that the wafer equivalent in thickness to the final product wafer is chamfered.

Next, in step (e), the chamfered dummy wafer is measured for its chamfered shape. For the measurement of the chamfered shape, it is convenient and preferable to use the above-described measurement method employing a transmissive light method to derive each dimension of the chamfered shape by subjecting captured images to image binarization, but even if measurements are performed using various other measurement methods, the present invention is applicable without difficulty so long as the shape of the chamfered portion of the wafer can be measured.

Next, in step (f), the chamfered shape is evaluated. For example, the range that can be tolerated as a deviation from the target chamfered shape can be ±2° for θ1 and θ2 and ±0.03 mm for X3, but this is not restrictive.

In step (f), the dimensions, such as θ1, θ2, and X3, are compared to the target chamfered shape, and if they fall within the tolerable range, control advances to the product process in step (h).

On the other hand, if the dimensions, such as θ1, θ2, and X3, fall outside the standard, the grindstone for chamfering is corrected in step (g).

In the process of correcting the grindstone for chamfering in step (g), the grindstone for chamfering may be reproduced after redesigning its shape considering deviations of the values θ, X3, etc., but the desired chamfered shape can be obtained in a shorter period of time by correcting the shape of the grindstone for chamfering on machine. Furthermore, such an on-machine shape correction of the grindstone for chamfering can be realized by, for example, a chamfering machine provided with an on-machine shape correcting function as described below.

The chamfering machine W-GM-5200 manufactured by TOSEI Engineering Corp. has a truing function of elaborating the shape of the grindstone for chamfering on machine (FIGS. 12 and 13). The truing function of this machine enables shape correction of the forming groove in the grindstone for chamfering 11 made up of a resin material and #1500 to #3000 diamond, using a resin truer 21 containing abrasive grains of about GC#300 and trued by a master grindstone 22 made up of #300 to #600 metal.

In this case, the truer 21 and the grindstone for chamfering 11 in contact with each other can be vertically rocked relative to each other as shown in FIG. 12, thereby adjusting the width of the groove in the grindstone for chamfering 11.

In addition, the master grindstone 22 and the truer 21 in contact with each other can be vertically rocked relative to each other as shown in FIG. 13, thereby adjusting the shape of the truer 21 to allow the truer 21 to be used for truing the grindstone for chamfering 11.

Note that when the cylindrical rotary outer-diameter grindstone is prepared in step (b), matching of the chamfered shape on machine can also be realized by correcting the shape of the grindstone for chamfering and correcting a numerical control program for defining the movement locus of the center of the cylindrical rotary outer-diameter grindstone.

After correcting the grindstone for chamfering in a manner as described, steps (d) to (f) are performed again to chamfer the dummy wafer equivalent in thickness to the product wafer and evaluate the chamfered shape.

Then, if the result of the chamfered shape evaluation in step (f) satisfactorily meets the standard, control advances to the product process in step (h) for actual production of the product wafer.

In this product process, first, the grindstone for chamfering produced and corrected in the above steps is used to chamfer the as-sliced wafer. Next, the processes, such as flattening, etching, and polishing, are performed in a conventional manner to obtain the product wafer.

The wafer produced through the above steps has its chamfered shape sufficiently in accordance with the standard dimensions of the target chamfered shape.

Furthermore, according to the wafer production method of the present invention, the dummy wafer used is equivalent in thickness to the product wafer, and therefore matching of the chamfered shape can be directly performed. As a result, it is possible to accurately correct the grindstone for chamfering in a shorter period of time.

In the second embodiment of the present invention, intended chamfer values are set as production control values for a product wafer to be produced, before advancing to the product process in step (h) of FIG. 1 in the first embodiment. An exemplary outline of the second embodiment is shown in FIG. 2. The second embodiment of the present invention is as outlined below.

Steps (a') to (g') in FIG. 2 are the same as steps (a) to (g) in FIG. 1.

The chamfered shape is evaluated in step (f'), and if the chamfered shape sufficiently meets the standard, control advances to step (h').

In step (h'), a dummy wafer (an as-sliced dummy wafer) equivalent in thickness to the as-sliced wafer actually introduced in the product process is prepared. The dummy wafer may be the as-sliced wafer itself, but this is not restrictive, and any processed wafer can be used so long as it is made up of the same material as the as-sliced wafer and has an equivalent thickness.

Next, in step (i'), the dummy wafer prepared in step (h') is subjected to chamfering as in step (d') (or as in step (d) of FIG. 1) using the grindstone for chamfering having passed the evaluation in step (f').

Next, in step (j'), the dummy wafer chamfered in step (i') is measured for its chamfered shape before performing flattening, etc., on the dummy wafer, the measured values are set as intended chamfer values serving as production control values for the product wafer to be produced. For example, when the thickness of the product wafer is in the range from 0.2 mm to 1 mm, significant figures for the intended chamfer values are preferably in units of 1° for θ1 and θ2 and in units of 0.01 mm for X3. Tolerances are set in accordance with customer demands, conditions of the chamfering machine, etc., and for example, when the thickness of the product wafer is in the range from 0.2 mm to 1 mm, the tolerances can be about ±3° for θ1 and θ2 and about ±0.05 mm for X3.

In the product process of the next step (k'), the intended chamfer values are referenced to determine whether the chamfered shape is appropriately formed.

EXAMPLES

Hereinafter, the present invention will be described more concretely by providing examples of the invention, but the present invention is not limited to them.

Example 1

A single crystal silicon wafer of 775 μm thickness, which is the same as the product wafer, was prepared as a dummy wafer, and steps (a) to (e) in FIG. 1 were performed using the grindstone for chamfering 11 with a forming groove.

As a result, the post-chamfering shape of the dummy wafer deviated from a design shape, i.e., a target shape, as shown in Table 2, such that the values θ1 and θ2 were larger by about 3° and the value X3 was less than about 35 μm ((f) of FIG. 1).

It can be appreciated from the above results for the dummy wafer that the chamfered dummy wafer has the length X3 of 585 μm, which is about 35 μm shorter than the target length for X3 which is 620 μm. Accordingly, a setting was made to perform swinging up and down of ±17 μm (with an amplitude of 34 μm) at the time of truing the grindstone for chamfering, and the truing was performed for widening the forming groove in the grindstone for chamfering ((g) of FIG. 1). The dummy wafer was chamfered again using the grindstone for chamfering thus corrected, resulting in a chamfered shape within the standard ((d) to (f) of FIG. 1), and therefore the corrected grindstone for chamfering was used to perform the product process ((h) of FIG. 1).

As a result, the chamfered shape of the product wafer fell within the range of the design shape as shown in Table 2.

TABLE 2

|  | θ1(°) | θ2(°) | X3(mm) |
|---|---|---|---|
| Design shape | 16 to 20 (18 ± 2) | 16 to 20 (18 ± 2) | 0.59 to 0.65 (0.62 ± 0.03) |
| Post-chamfering shape of dummy wafer | Ave. = 21.2 Max. = 22.3 Min. = 20.5 | Ave. = 21.1 Max. = 22.2 Min. = 20.8 | Ave. = 0.585 Max. = 0.602 Min. = 0.579 |
| Shape of product wafer | Ave. = 18.1 Max. = 18.6 Min. = 17.1 | Ave. = 18.3 Max. = 19.2 Min. = 17.9 | Ave. = 0.618 Max. = 0.640 Min. = 0.599 |

Example 2

Before actually performing the product process with the grindstone for chamfering appropriately shaped in Example 1, intended chamfer values were set as below in accordance with the steps shown in FIG. 2. The grindstone for chamfering corrected in Example 1 was used to (h') prepare an as-sliced wafer of 910 μm thick as a dummy wafer, and (i') the wafer was chamfered, and thereafter (j') the chamfered shape was measured to set the intended chamfer values.

Measurement results for the chamfered shape of the chamfered as-sliced dummy wafer, and examples of the intended chamfer values set based on the results are shown in Table 3.

TABLE 3

|  | θ1(°) | θ2(°) | X3(mm) |
|---|---|---|---|
| Chamfered shape of as-sliced dummy wafer | Ave. = 14.6 Max. = 15.2 Min. = 12.9 | Ave. = 14.5 Max. = 15.3 Min. = 13.0 | Ave. = 0.647 Max. = 0.670 Min. = 0.625 |
| Intended chamfer values | Center value = 15 (±3) | Center value = 15 (±3) | Center value = 0.65 (±0.04) |

As can be clearly appreciated from Table 3, by chamfering the wafer having the same thickness as the as-sliced wafer using the grindstone for chamfering that allows the product wafer to ultimately have a chamfered shape in accordance with the standard, θ1 and θ2 are rather shifted compared to the standard. The results are significantly different from conventional cases where the dummy wafer having the same thickness as the as-sliced wafer is used and the grindstone for chamfering is produced by chamfering the dummy wafer so as to have θ1 and θ2 satisfying the standard for the product wafer.

Note that the present invention is not limited to the above embodiments. The above embodiments are merely illustrative, and the technical scope of the present invention encompasses any equivalents that have substantially the same configuration as the technical idea described in the claims of the present invention and can achieve similar effects.

The invention claimed is:

1. A method for producing a wafer at least comprising:
a slicing step of slicing an ingot to obtain a wafer,
a chamfering step of chamfering the wafer sliced from the ingot using a grindstone for chamfering,
a step of obtaining a product wafer thinner than the chamfered wafer by performing a flattening process on the chamfered wafer,
a correction step comprising:
   chamfering a dummy wafer equivalent in thickness to a predetermined standard thickness of the product wafer,
   measuring chamfered portions of the chamfered dummy wafer, and
   correcting the shape of the grindstone for chamfering based on the measured chamfered portions of the chamfered dummy wafer, at least before the chamfering step of chamfering the wafer sliced from the ingot, thereby chamfering the wafer sliced from the ingot using the grindstone for chamfering having its shape corrected,
wherein at least after the correction step, the grindstone for chamfering having its shape corrected is used to chamfer a dummy wafer equivalent in thickness to the wafer sliced from the ingot,
dimensions of chamfered portions of the chamfered dummy wafer are measured, and
dimensions of the measured chamfered portions of the dummy wafer are set as intended chamfer values for the wafer sliced from the ingot.

2. The method for producing a wafer according to claim 1, wherein the grindstone for chamfering is corrected on machine.

3. The method for producing a wafer according to claim 1, wherein the grindstone for chamfering has a forming groove, and chamfering is performed with the forming groove in contact with the periphery of the wafer.

4. The method for producing a wafer according to claim 2, wherein the grindstone for chamfering has a forming groove, and chamfering is performed with the forming groove in contact with the periphery of the wafer.

5. The method for producing a wafer according to claim 1, wherein the grindstone for chamfering is a cylindrical rotary outer-diameter grindstone, and the rotary outer-diameter grindstone for chamfering is movable relative to thickness and diameter directions of the wafer to chamfer the wafer.

6. The method for producing a wafer according to claim 2, wherein the grindstone for chamfering is a cylindrical rotary outer-diameter grindstone, and the rotary outer-diameter grindstone for chamfering is movable relative to thickness and diameter directions of the wafer to chamfer the wafer.

* * * * *